United States Patent [19]

Snoeys et al.

[11] Patent Number: 5,465,002

[45] Date of Patent: * Nov. 7, 1995

[54] INTEGRATED VLSI RADIATION/PARTICLE DETECTOR WITH BIASED PIN DIODES

[75] Inventors: Walter Snoeys, Santa Clara County; Sherwood I. Parker, Alameda County, both of Calif.

[73] Assignee: University of Hawaii, Honolulu, Hi.

[ * ] Notice: The portion of the term of this patent subsequent to Aug. 17, 2010 has been disclaimed.

[21] Appl. No.: 52,896

[22] Filed: Apr. 26, 1993

Related U.S. Application Data

[63] Continuation of Ser. No. 763,817, Sep. 23, 1991, Pat. No. 5,237,197, which is a continuation of Ser. No. 371,891, Jun. 26, 1989, abandoned.

[51] Int. Cl.⁶ .................. H01L 31/115; H01L 31/117
[52] U.S. Cl. .................. 257/458; 250/370.9; 250/370.8
[58] Field of Search .................. 257/458; 250/370.9, 250/370.8

[56] References Cited

U.S. PATENT DOCUMENTS

| | | | |
|---|---|---|---|
| 3,535,774 | 7/1968 | Baker | 257/623 |
| 3,551,761 | 12/1970 | Ruoff | 257/443 |
| 3,604,987 | 9/1971 | Assour | 257/458 |
| 3,772,576 | 11/1973 | Nienhuis | 257/620 |
| 4,183,034 | 1/1980 | Burke et al. | 257/432 |
| 4,198,646 | 4/1980 | Alexander | 257/458 |
| 4,460,912 | 7/1984 | Takeshita et al. | 257/223 |
| 4,691,224 | 9/1987 | Takada | 257/495 |
| 4,801,995 | 1/1989 | Iwanishi | 257/495 |

OTHER PUBLICATIONS

Parker, *Nuclear Inst. . . . Research* A275 1989 pp. 494–516 North Holland "A Proposed VLSI. . . Detection".

*Primary Examiner*—Jerome Jackson
*Attorney, Agent, or Firm*—Flehr, Hohbach, Test, Albritton & Herbert

[57] ABSTRACT

A structure for a detector with a high spatial resolution is characterized not only as integrating on the same chip both PIN diodes and readout circuitry for detecting the charge collected through the individual diodes, but places the junction and collection electrode on opposite ends of the PIN diode. This reduces the fields at the collection electrode, and allows the wells containing the readout circuitry, which should be located as close to the collection electrode as possible to minimize collection electrode capacitance, to be placed in a low field region. The bias voltage required on the wells can then be reduced, and the electrodes for collecting the generated charge can be made smaller.

17 Claims, 8 Drawing Sheets

INTEGRATED VLSI RADIATION/PARTICLE DETECTOR WITH BIASED PIN DIODES

CROSS-REFERENCE TO RELATED APPLICATION

This is a continuation of application Ser. No. 07/763,817 filed Sep. 23, 1991, now U.S. Pat. No. 5,237,197 (Aug. 17, 1993) which is a continuation of 07/371,891 filed Jun. 26, 1989 now abandoned.

BACKGROUND OF THE INVENTION

This invention relates to a device for detecting X-rays, infrared light and ionizing particles. In particular, this invention relates to an integrated VLSI pixel detector having PIN diodes which are reverse biased and collect the charge generated by an incident beam of radiation or ionizing particles.

PIN diodes, which are reverse biased and collect the charge generated by an incident beam of radiation or ionizing particles, can be used in the detection of such radiation and particles. A detection device using such PIN diodes was disclosed, for example, by one of the present inventors in U.S. patent application Ser. No. 198,357, filed May 25, 1988 and in "A Proposed VLSI Pixel Device for Particle Detection" (Nucl. Instr. and Meth. A275, 494 (1989)), which is hereby incorporated by reference. With such PIN diodes arranged in a one-dimensional or two-dimensional array on a chip, there are different ways of connecting them to readout circuitry for detection. One way is to put the readout circuitry on a separate integrated circuit and then to bump-bond that chip to the detector chip containing only the PIN diodes. Another is to integrate all, or at least a large part of the readout circuitry with the diodes on the same chip. Both approaches have advantages and disadvantages. For application to high energy physics, however, the bump-bonding method has a major disadvantage wherein the two chips bonded together become thicker than one chip which integrates both detector and readout circuitry. This causes significantly more scattering and hence adversely affects the quality of the measurement.

The structure proposed in the references cited above is characterized as having the junction of the PIN diodes created by a diffusion at the front side of its wafer and the readout circuitry contained in wells which are of the same conduction type as the substrate and very close to the junction of the PIN diodes where the electric field is high. To divert the field lines from the well to the collection electrode, in order to collect most of the charge generated by the incident radiation, a high bias is necessary for the well. In order to keep this bias within a reasonable limit, the size of the collection electrode must be made quite large with respect to the well. This results in a significant loss of area on the chip and a considerable loss in (spatial) resolution.

SUMMARY OF THE INVENTION

It is therefore an object of the present invention to provide an efficient integrated VLSI detector with biased PIN diodes adapted to collect the charge generated by incident radiation such as X-rays and infrared light or ionizing particles such as beta-rays.

It is a particular object of the present invention to provide such a detector with which a high spatial resolution can be obtained without excessive well bias.

A structure for such a detector with which the above and other objects of the present invention can be achieved is characterized not only as integrating on the same chip both PIN diodes and readout circuitry for detecting the charge collected through the individual diodes, but places the junction and collection electrode on opposite ends of the PIN diode. This reduces the fields at the collection electrode, and allows the wells containing the readout circuitry, which should be located as close to the collection electrode as possible to minimize collection electrode capacitance, to be placed in a low field region. The bias voltage required on the wells can then be reduced, and the electrodes for collecting the generated charge can be made smaller.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings.

DETAILED DESCRIPTION OF THE INVENTION

Figure 1A:
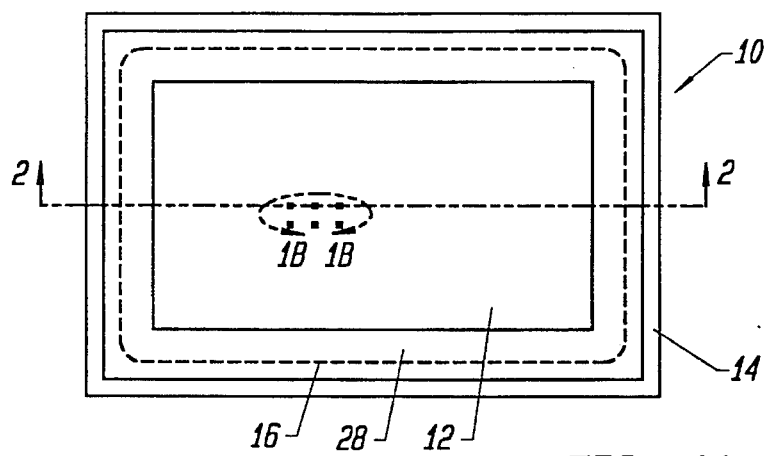
FIG. 1A is a schematic plan view of the front side of a whole chip for an integrated VLSI detector embodying the present invention.

In FIGS 1 and 2, numeral 10 generally indicates one complete chip serving as a structure for an integrated VLSI detector embodying the present invention. As can be seen more clearly in FIG. 2, the chip 10 is substantially composed of a plurality of detecting elements on a planar P-type silicon substrate 12 (to provide a depletion layer) with a front side surface and a back side surface. Note that one could also have a planar N-type substrate to start with, but all other doping types have to be reversed as well.

Figure 1B:
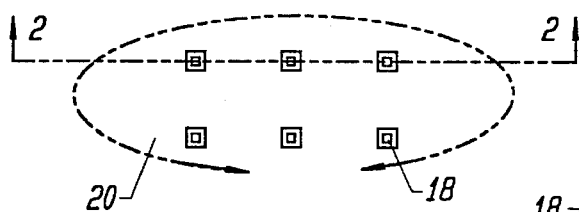
FIG 1B is an enlarged view of a section of FIG. 1A.

An oxide layer 14 is formed on the front side surface along its edges and an N⁺-type diffusion 16 is formed on the back side surface to create a junction 17 for all detecting elements. The substrate 12 is fully depleted so that the front side collection electrodes 18, which contact the P-type substrate, are electrically isolated. In the central region of the chip 10 on the front side surface of the substrate 12 is an array of P⁺-type contact elements serving as collection electrodes 18. Each of the collection electrodes 18 collects charge from a different part of the PIN diode 19. PIN diode here refers to the diode having a junction created by the diffusion 16 on the back side of the substrate 12. Readout circuitry (not shown) associated with the individual collection electrodes is contained in N wells 20 at the front side of the P-type substrate 12 as shown in FIG 1B and in FIG. 2B. Since the collection electrodes 18 are quite small, one single large well may be provided, all readout circuitry being placed therein. In such a situation, openings are created at regular intervals inside this single well by masking their positions from the well implant and the collection electrodes 18 are individually placed in such openings. The choice of connecting the wells to make one big well, as discussed above, has the advantage of improving the spatial resolution of the detection function being implemented, because more area is available for circuitry. The details of an example of how to connect the collection electrodes and readout circuitry are provided by the incorporated Parker application. This is an example, and there are other ways to accomplish this function.

Figure 2B:
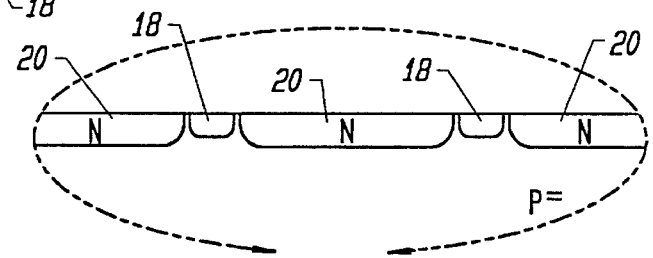
FIG. 2B is an enlarged view of a section of FIG. 2A.
Figure 2A:
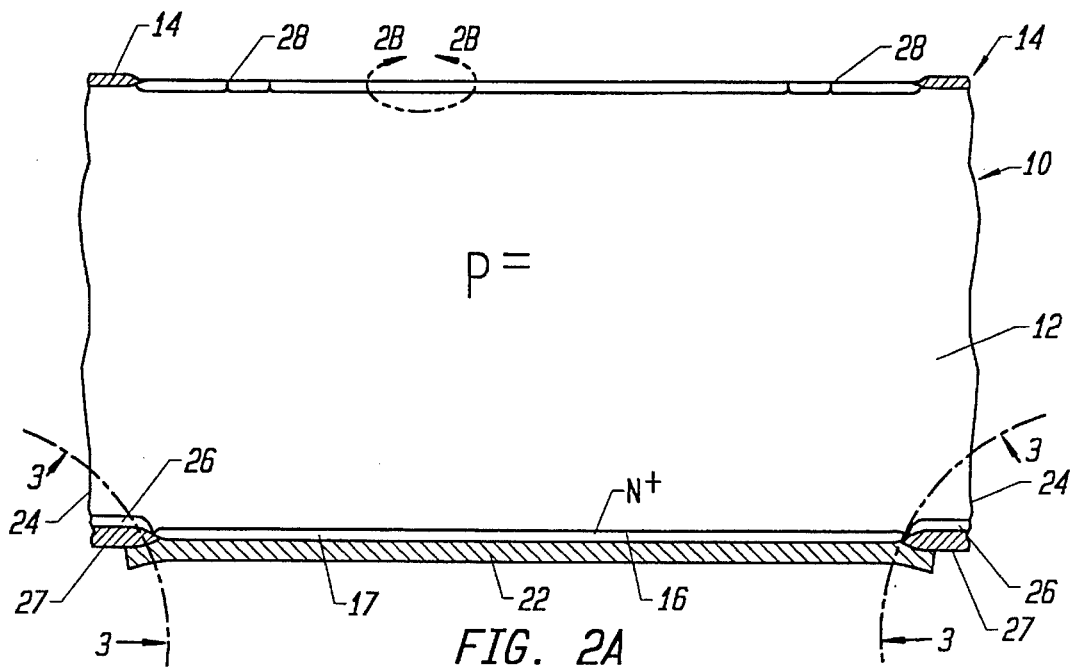
FIG. 2A is a schematic sectional view of the chip of FIG. 1 taken along the line 2—2 therein.

In FIGS. 2A and 2B, numeral 22 indicates a metal layer serving as a back side electrode contacting the N⁺-type diffusion 16 and numerals 24 indicate sawcuts of the chip 10. In order to electrically isolate the sawcuts 24 from this back side electrode 22, the back side surface of the chip 10 must be patterned and the backside surface between the sawcuts 24 and the junction 17 should be well passivated. This is normally accomplished by forming an oxide layer 27 on the surface. For a P-type bulk material, however, care should be taken that the silicon surface around the diffusion 16 is not inverted due to fixed oxide charge. Otherwise, the inversion layer would reach the side of the chip and cause a short across the diode. One way to prevent the surface from inverting, is to provide a P-implant 26, as illustrated in a back side corner portion of the chip of FIG. 2. When the bulk substrate 12 is depleted, the negative fixed charge of the implant 26, rather than mobile electrons, terminates the field lines from the oxide charge. With reference both to FIGS. 1 and 2, numerals 28 indicate peripheral regions (to be described more fully below), containing control and extra readout circuitry. Such control and extra readout circuitry may include for instance local amplifiers and local buffers described in the incorporated Parker application and not herein.

Figure 3:
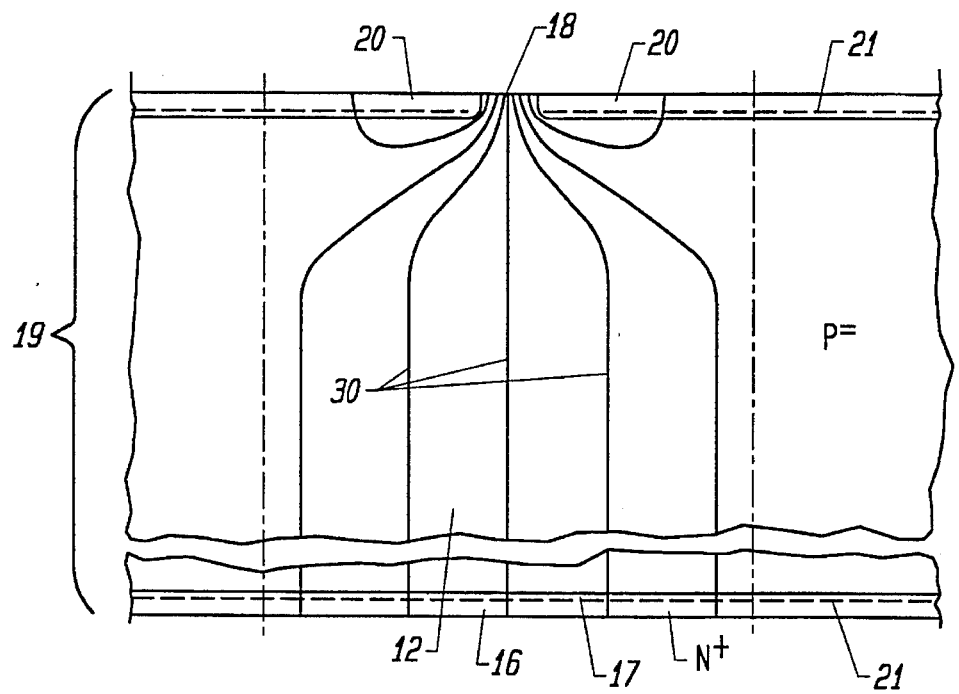
FIG. 3 is an enlarged view of a portion of FIG. 2 corresponding to one detecting element, showing in addition, drift paths for electrons and holes.
Figure 4:
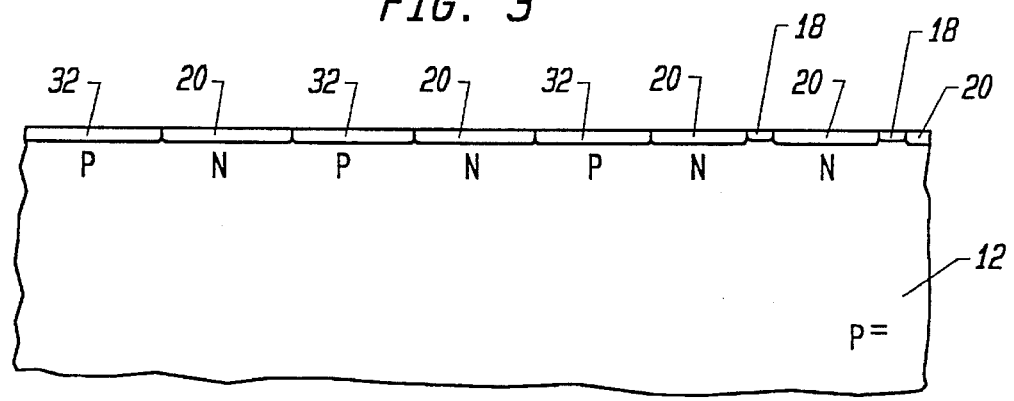
FIG. 4 is a sectional view of a portion of the chip shown in FIGS. 1 and 2 which illustrate the formation of the peripheral regions containing control circuitry.
Figure 4:

FIG. 3 shows a portion of the chip 10 of FIGS. 2A and 2B. It details one of the basic building blocks (or unit cells) associated with the PIN diode 19, including one of the collection electrodes 18 and a portion of the adjacent well 20 containing the readout circuitry (not shown). As explained above, the unit cell according to the present invention is characterized as follows: (1) the potential of the well 20 containing the readout circuitry deflects the flow lines 30 in the depleted bulk, which start at the back side of the device, so they all terminate on the collection electrodes, and do not vary significantly when voltages change on the circuitry within the well; (2) the well 20 is separated as far as possible from the high field regions near the PIN diode junction to minimize the required well potential and fields. It is to be noted that the well 20 is on the front side surface of the chip 10 and the junction 17 is formed at the back side of the P-type substrate 12 near the back side surface. According to the present invention, furthermore, the readout circuit is put in a well 20 of conduction type opposite to that of the substrate.

It should be noted that the embodiment of the present invention depicted in FIGS. 1–5 is drawn for a P-type substrate and an N-type well but this is not intended to limit the scope of the present invention. If an N-type wafer is used, all regions depicted in FIGS. 1–3 should be converted into opposite conduction types. In FIG. 3, broken lines 21 indicate the border of depleted N- and P-regions.

When radiation (photons or ionizing particles) is incident on the chip 10, most of the charge which is thereby generated is collected by the collection electrodes 18. In FIG. 3, numeral 30 indicates flow lines inside the depletion layer coming from the back side of the device. In order to collect the maximum possible amount of the charge thus generated, all the flow lines 30 inside the depletion layer starting at the back side electrode (the metal layer 22) should end on the collection electrode 18 instead of the well 20 containing the readout circuitry. For this purpose, the well 20 will have to be biased so as to repel the charge flowing towards the front side surface, thereby diverting it to the collection electrode 18. Since the charge carriers move mainly by drift inside the depletion layer, the biasing of the well 20 will add a lateral component to the electric field 30 serving to direct the flow lines from the well to the collection electrode. The field in a diode normally peaks very near its junction. According to the present invention, however, the well 20 is disposed as far away as practicable from the junction 17 such that the vertical field is very small near the well 20. Thus, only a minimal bias is necessary on each well 20 to divert the flow lines 30. The depletion layer starts from the back of the device and extends up into the bulk as the bias is increased. The fact that the substrate 12 needs to be completely depleted is not necessarily a disadvantage because, under normal conditions, there is a safety margin added to PIN diode bias to make sure that the substrate is fully depleted. If the substrate is not completely depleted in spite of this safety margin, the signal will go to zero and this can be easily detected. This is to be contrasted to the prior art detector in the references cited above wherein the depletion layer starts at the front side surface and extends down into the bulk as the bias is increased, and a local fluctuation of the substrate resistivity causing incomplete depletion will yield only a relatively low signal.

The circuitry around the array of PIN diodes for controlling the readout and the communication of the chip 10 to the outside is contained, as explained above, in the peripheral regions 28. One approach to forming the control circuitry in the peripheral regions 28 next to the central array of detecting elements 29 is depicted schematically in FIG. 4 and is characterized as using full CMOS and alternating N-wells 20 and P-wells 32. The P-wells act as collection electrodes, but are not used to measure generated charge. They serve to preserve the repeating pattern of the array in the center part of the chip 10, to minimize possible edge effects on the electric field. Another approach is to use a small number (two, for example) of outermost rows and columns as dummies by grounding them. The P wells also prevent undesirable interaction between the n-channel MOS transistors and the diffusion creating the junction of the PIN diode (causing e.g., punchthrough and breakdown).

Figure 5:
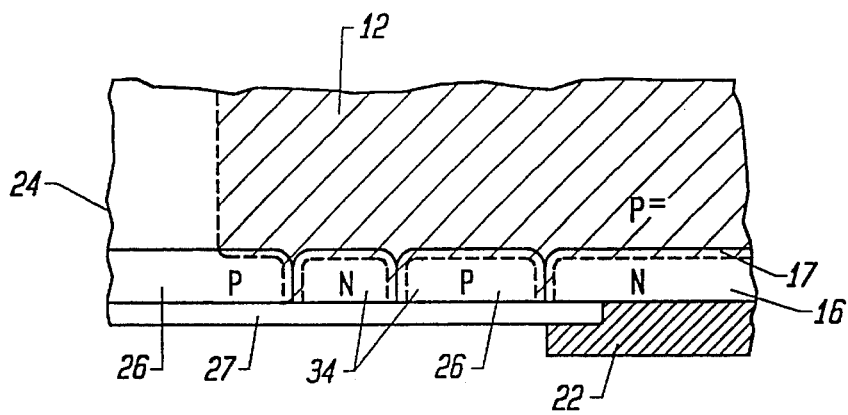
FIG. 5 is an enlarged sectional view of a back side corner portion of the chip of FIG 1 and FIG. 2 under the lines 3—3 in FIG. 2A; and it is an example of how the high field region at the diode junction can be isolated from the conducting silicon along the side saw cut; however this is an example only and is not the only way of accomplishing this goal.

As explained above, a P-implant 26 is provided for preventing surface inversion. Care must also be taken regarding breakdown of the junction 17 between the P-implant 26 and the diffusion 16 of the PIN diode. A gap can be left between the implant and the diffusion, but there will then be an inversion layer connecting the diffusion 16 with the implant 26. When the diffusion of the back side electrode and the extra implant abut each other, breakdown may occur directly therebetween. One of the techniques for alleviating the breakdown problem is to round off the corners to avoid electric field concentrations. Another technique is, as shown in FIG. 5, to introduce floating layers 34 between the diffusion 16 and the outermost of the implants 26 which ends at the edge (sawcuts 24) of the chip 10. In FIG. 5, numeral 27 indicates an oxide layer and the broken lines again indicate boundaries of depleted N- and P-regions. These floating layers 34 serve to effectively divide the total voltage over several junctions in series so that each junction has to support only a fraction of the total voltage.

Another problem encountered in forming the junction at the back side relates to the potential barrier between the well 20 at the front side and the diffusion 16 at the back side. If the potential barrier therebetween is not high enough, there will be carriers going from the well 20 over the barrier into the depleted bulk from which they will be swept by the electric field down to the diffusion 16. This phenomenon is normally referred to as "punchthrough" and would yield an unacceptably large current from the well 20 to the back side electrode 22 of the PIN diode. The problem of punchthrough is solved by biasing the structure appropriately. The potential barrier between the well 20 and the back side electrode 22 is influenced by the doping level and the voltage differences between the collection electrode, the well, and the backside electrode, and by the size of the collection electrodes relative to their spacing. An increase in the reverse bias on the PIN diode decreases the barrier, and an increase in the bias between the well and collection electrode increases the barrier. Increasing the size of the collection electrodes relative to their spacing increases the potential barrier. If the reverse bias on the PIN diode is too high, it becomes necessary to increase the bias between the well 20 and the collection electrode 18 in order to get a large enough potential barrier to avoid punchthrough and there is the risk of breakdown because the electric field near the collection area becomes too high. Thus, the PIN diode bias and well bias should be chosen to avoid punchthrough, to obtain full depletion, to minimize signal loss, and to avoid breakdown. The PIN diode bias is also required to be high enough to obtain a fully depleted substrate with a margin to account for the uncertainty of the substrate resistivity.

The well bias also serves other purposes. It minimizes the capacitance of the charge collection electrode by surrounding it with a large depletion layer. It also reduces the relative influence of local voltage and doping fluctuations on the electric fields in the depletion region.

Figure 6A:
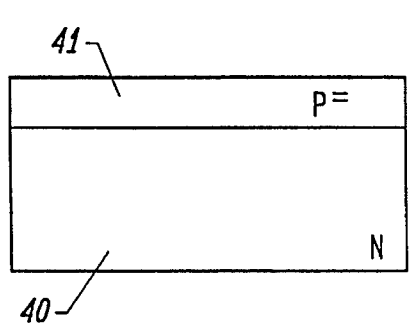
FIGS. 6A, 6B and 6C are sectional views showing a process of producing another detector structure of different characteristics embodying the present invention.
Figure 6B:
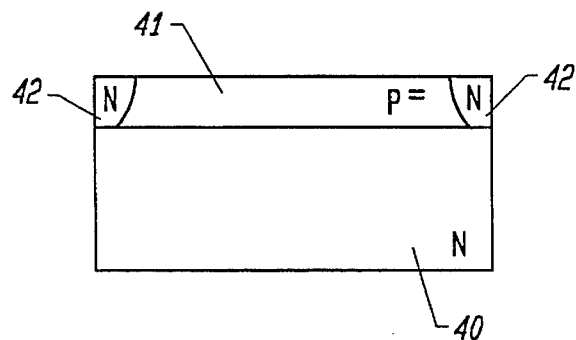
Figure 6D:
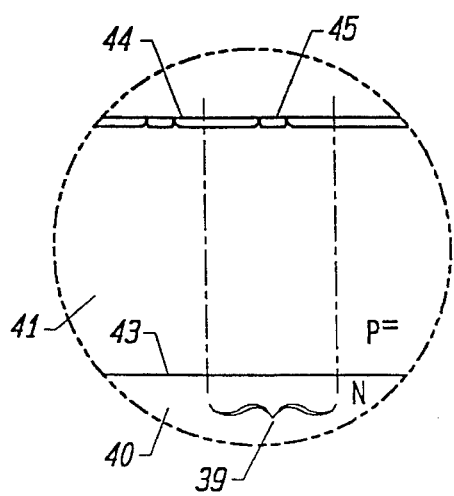
FIG. 6D is an enlarged view of a section of FIG. 6C.
Figure 6C:
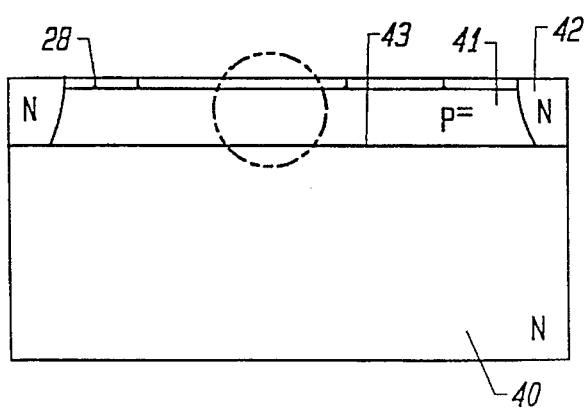

The foregoing description of a preferred embodiment of the invention has been presented for purposes of illustration and description. It is not intended to be exhaustive or to limit the invention to the precise form disclosed, and many modifications and variations are possible in light of the above teaching. For example, the junction 17 need not be actually physically on the back side of the wafer. Another detector structure according to the present invention and not requiring such a large depletion layer may be produced by starting with a substrate 40 which is not of such high resistivity and by growing a nearly intrinsic epi layer 41 of the opposite doping type as the substrate as shown in FIG. 6A. Thereafter, an implant and diffusion of an isolation ring 42 of the same type as the substrate are carried out as shown in FIG. 6B such that the junction 43 between the epi layer 41 and the substrate 40 will not be shorted. If such a ring is created, the actual junction ends on the front side surface of the chip and it can be passivated easily by growing an oxide. Thereafter, circuitry (in wells 44) and collection electrodes 45 are placed on the front side as shown in the enlargement section (FIG. 6D) of FIG. 6C, and one detecting element 39 is shown in the enlargement section. The basic structure according to this embodiment is the same as that described above by way of FIGS. 1–3, except that the depletion layer in the structure of FIG. 6C is much smaller. It is to be noted that one hereby gains the option, because of the isolation ring, to contact the back side of the PIN diode from the front side.

Principles of operation of structures according to the present invention, including ways to bias the device in order to avoid punchthrough and to collect all the charge generated in the depletion layer, have been studied; and comparison with prior art devices made by way of simulations carried out by the two-dimensional device simulator PISCES II (Stanford Electronics Laboratory, Stanford University, 1984). Since the structure is essentially three-dimensional, these two-dimensional simulations are approximations but they give an idea of the working principle of the structure. One of the major differences between prior art devices and structures according to the present invention is that the substrate does not need to be depleted completely in the case of prior art devices because their depletion layer starts from the collection electrode at the front side rather than from the back side. Another major difference is that the electric field peaks close to the junction but the junction is near the front side surface with prior art devices, and the well containing the readout circuitry must be biased rather high in order to bend the nearly vertical field lines towards the collection electrodes. In fact, in the case of prior art devices, one needs to bias the well not only to divert the field lines correctly but also to be able to deplete the substrate underneath the well. To be able to get full depletion at a reasonable well bias, the area of the collection electrodes must be increased with respect to that of the well.

Factors that determine a "reasonable" well bias include the breakdown voltage of source and drain junctions inside the well, how deep the well can be made in order to prevent it from complete depletion, and what maximum dose can be implanted in order to adjust the threshold voltage of MOS transistors inside the well. The well size is set by the local readout circuitry, while the array pitch (and thus resolution of the charge collected) is set by the sum of the lateral sizes of the well, collection electrode, and intervening depletion region. The present invention minimizes this sum for any given well size, thus maximizing the spatial resolution.

The principle of the invention disclosed above can also be used to make a device which is able to differentiate short range radiation such as visible light from penetrating ionizing radiation. Such capability is based on the recognition of the phenomenon that visible light penetrates only a micron or so while many forms of ionizing radiation go significantly deeper. Consider, for example, a P-type substrate, in which the collection electrodes are arranged at the front side and diode junctions are arranged at the back side according to the present invention. In operation, the electrons of the hole-electron pairs created near the front side surface of the structure go to an N-type electrode on the front side, while the holes go to a P-type electrode also at the front side. The holes of the hole-electron pairs created deeper in the structure go to the same electrode as before, while the electrons go to another electrode, an N-type electrode located at the back side surface. By subtracting the signal coming from the electrons detected at the back side electrode from the signal coming from the holes detected at the front side electrode, most hole electron pairs created by the incidence of penetrating ionizing radiation are effectively vetoed, leaving only for storage and later analysis the signals due to those hole-electron pairs created by the incidence of visible light at the surface of the structure; such visible light does not create any hole-electron pairs which penetrate through the substrate to the lower substrate electrodes.

Figure 7:
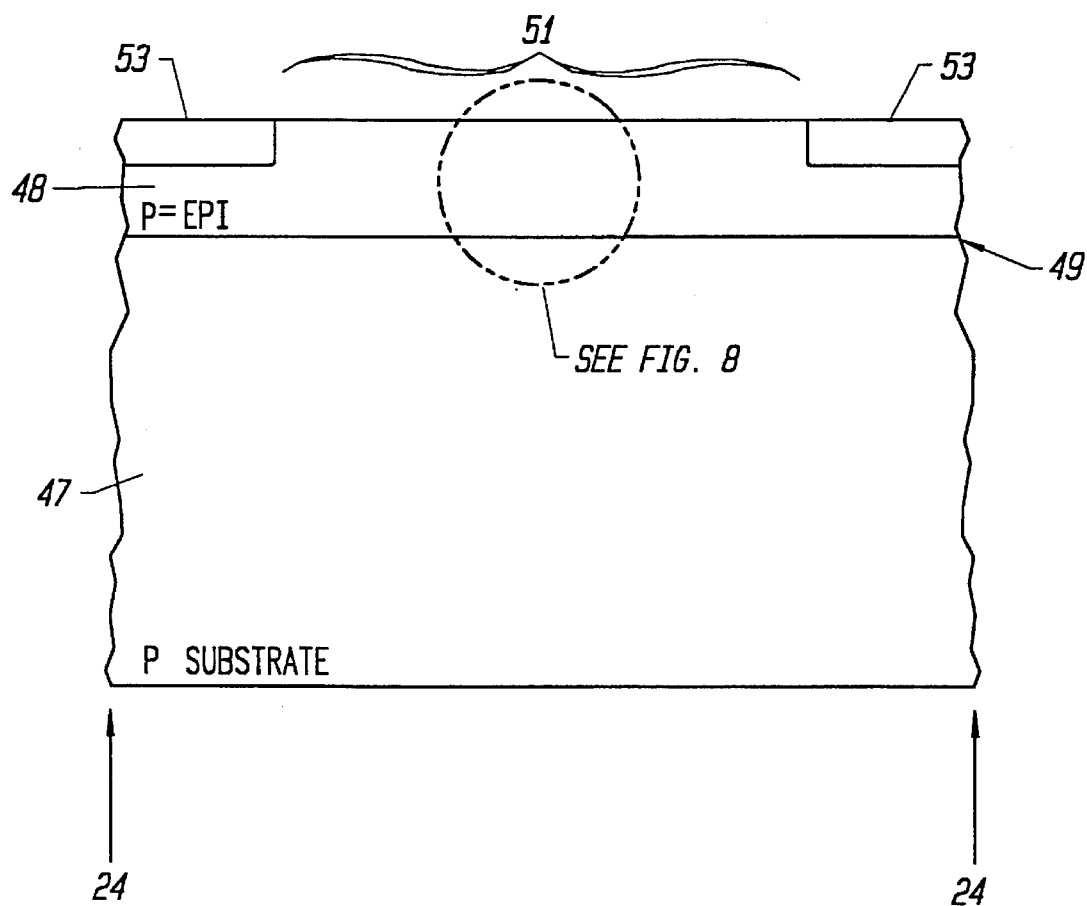
FIG. 7 illustrates another embodiment of the present invention.
Figure 8:
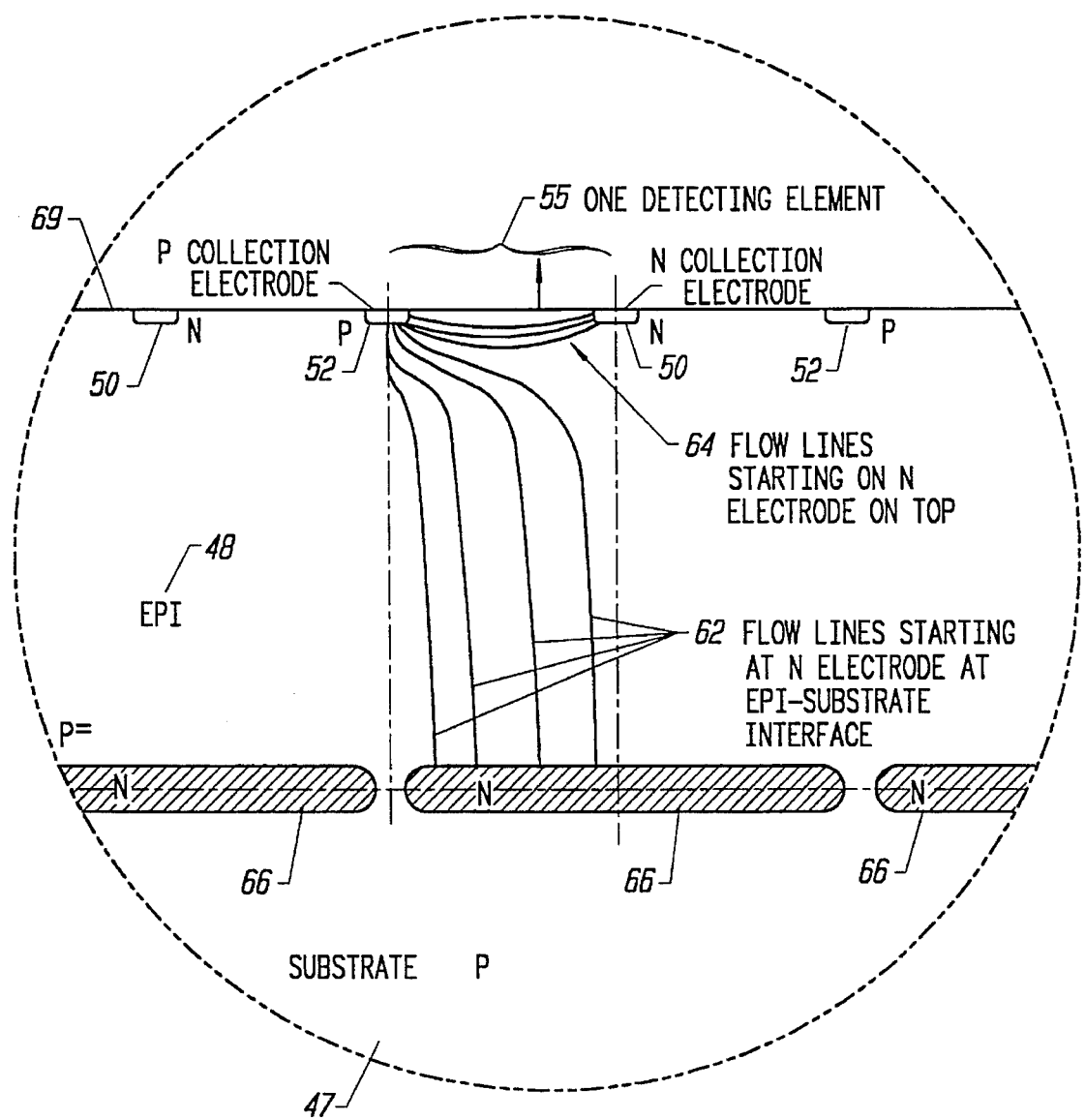
FIG. 8 is a magnification of a part of FIG. 7.
Figure 9:
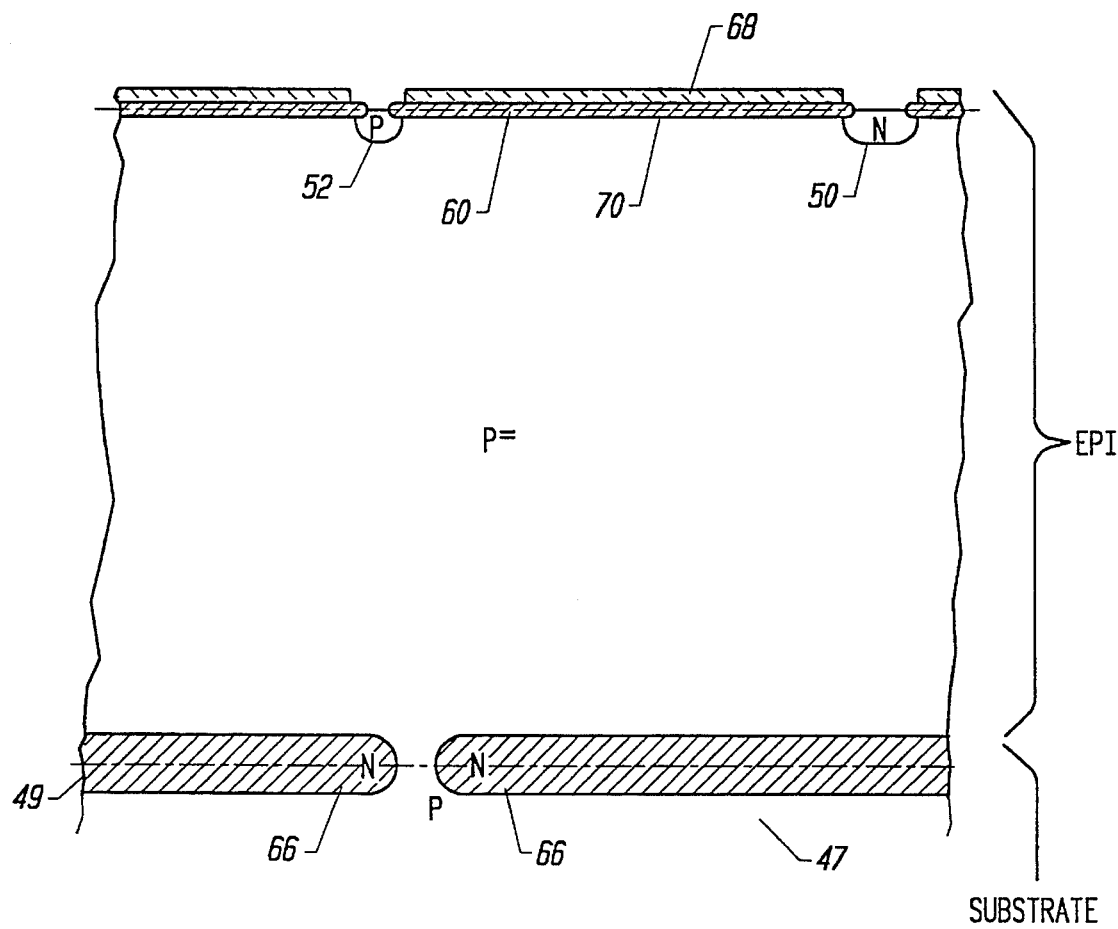
FIG. 9 illustrates a structure which is an improvement over the structure shown in FIG. 7.

However, in the embodiment described above, the well containing the readout circuitry takes up the entire area between the collection electrodes. Any light incident on that area would generate charge within the well containing the readout circuitry. Thus, the charge generated by the incident light would not be collected. In order to effectively separate and differentiate the visible light and penetrating ionizing radiation, the structure in the previous described embodiment should be modified. FIGS. 7–9 illustrate in detail the modified structure.

FIG. 7 illustrates a cross-section of the device. The structure is shown for a P-type substrate 47, but a change of all semiconductor types to the opposite type would yield a workable device as well. The chip consists of an array of detecting elements 51 in the center and additional readout circuitry 53 at the side of the chip. The numeral 24 indicates the sawcuts on the chip. The structure is drawn for a one dimensional array (consisting of strips), but the same principles can be applied to obtain a two dimensional array (pixels). If desired, one of the two electrodes can be made much smaller than the other, in order to decrease its capacitance, and hence increase the signal to noise ratio. The substrate 47 is covered by a lightly doped epi layer 48 of the same polarity type, in which the detecting elements 51 as well as the readout circuitry 53 are defined.

FIG. 8 shows a magnification of a part of FIG. 7. In forming the device of FIG. 8, before the epi layer 48 was deposited, an array of strips 66 of opposite type to that of the substrate was created (e.g. by means of a masked implant) at the epi-substrate interface 49. The doping in these strips 66 diffuses into the epi layer 48 and the substrate during the epi deposition and also during the other subsequent anneals in the process.

On the top surface 69 of the epi layer 48, an array of diffusions 50, 52 of alternating conductivity type is created over the array at the epi-substrate interface 49 (as shown in FIG. 7 or FIG. 8) with electrodes of the same conductivity type each having equal pitch to the strips 66. The combination of electrodes 50, 52 and 66 yields the array of detecting elements.

FIG. 8 is a cross-section of a detecting element 55. The like type diffusions 52 on the top of the epi 48 correspond to the collection electrodes of the structure in the previously described embodiment. The opposite type diffusions. 50 correspond in function to the N well of the structure in the previously described embodiment, but are made much smaller.

The bias on the structure is similar to the bias of the structure in the previous described embodiment: the epi is fully depleted and all flow lines 62 starting from the strip at the epi-substrate interface end on the collection electrode 52 of the same type (p). The flow lines 64 starting on the collection electrode 50 of the opposite type (n) to the epi also end on the collection electrode 52 of the same type (p) as the epi.

The principle of operation is as follows. Suppose light is incident on the chip at location A. It will be absorbed in the top part of the epi, generating electron-hole pairs at that location. The electrons will go to the N-type electrode 50, while the holes will go to the P-type electrode 52. Because the holes and electrons are generated in pairs, there are as many electrons as holes, and the signals on the two collection electrodes are the same in magnitude but of opposite sign.

Suppose now that penetrating ionizing radiation is incident at the same location. It will traverse the entire depth of the device, and generate electron-hole pairs along its entire track in the silicon. The electron-hole pairs generated in the top part of the epi will do the same as described above for the ones generated by light, i.e., be collected by electrodes 50, 52. However, most of the electron-hole pairs will be generated deeper in the epi, and those will behave differently: the holes still will go to p-type collection electrode 52 on top of the silicon, following flow lines 62. The electrons however will go to the N-type electrode at the epi-substrate interface as shown in FIG. 7 or FIG. 8. Therefore now the signals on the N-type electrode 50 and P-type collection electrode 52 will not be the same in magnitude. The signal on the P-type electrode 52 will be much larger in magnitude than the one on the N-type electrode 50, and will be a little larger in magnitude but of opposite sign to the signal on the N-type electrode 66 at the epi-substrate interface 49. It should be clear from this that by monitoring the signals on the electrodes, and comparing them, it is possible to differentiate visible light from ionizing particles and vice versa.

Strictly speaking, one only needs to look at the signals on two of the three electrodes, but looking at all three gives more certainty because of redundancy. For that reason the electrode at the epi-substrate interface was not drawn continuously. If measuring the signal at only two of the three electrodes is satisfactory, the electrode at the epi-substrate interface can be made continuous. In that case one can go back to the structure in the previously described embodiment at FIG. 6C using epi, or the embodiment of FIG. 1 where the "well" is made smaller to become a second collection electrode, an N type collection electrode.

Four aspects should be pointed out: (1) the portion of visible light incident directly on the collection electrodes and on any readout circuitry will not produce hole-electron pairs that are collected by the readout. Therefore the area efficiency will be less than 100%; (2) the collection electrodes at the epi-Substrate interface 49 can be contacted in several ways, one of which is by plugs similar to the ones that contact buried layers of bipolar transistors; (3) The device that differentiates visible light from penetrating ionizing radiation is based on the differences in penetration depth between the two types of radiations. In principle, any two types of radiation which generate charge in the semiconductor can be differentiated provided one penetrates only a limited depth (e.g., a couple of microns) while the other one goes significantly deeper; (4) this device can also differentiate between two types of radiation which both generate charge having similar penetration depths, provided that the amount of the charge generated differs significantly between the two so that the differentiation can be based on the difference in magnitude of the signals generated by the types of radiation.

Another issue is the problem of charge inversion at the top surface underneath the oxide (most of the top surface will be oxidized to passivate it; however, in order not to overload the figure, the oxide was not drawn). Normally as explained in the previous text, an inversion charge will be formed in lightly doped p-type material, because of positive charge at the oxide-silicon interface. This should be avoided, as it would increase the capacitance of the n-type collection electrode on top, to which the inversion layer would be connected. Such an inversion layer would also increase the danger of breakdown, because the electric fields are likely to be high at the junction between the inversion layer and the p-type collection electrode.

One way to avoid an inversion layer is depicted in FIG. 9: a fieldplate 68 which has to be transparent to light, is put on top of the oxide 60, extending from P-type collection electrode 52 to N-type collection electrode 50, and means are provided to bias the device to a voltage such that the electric field caused by the fixed charge at the oxide-silicon interface 70 is compensated for, and an inversion layer is avoided. However, one should take care in avoiding a large decrease in signal voltage due to an increase in capacitance of the collection electrodes, caused by the presence of the fieldplate. One way this could be done is by making the fieldplate 68 out of a material which may incorporate a relatively high resistivity such that the capacitance between the collection electrodes is put in series with a large resistance, decreasing its influence.

Figure 10:
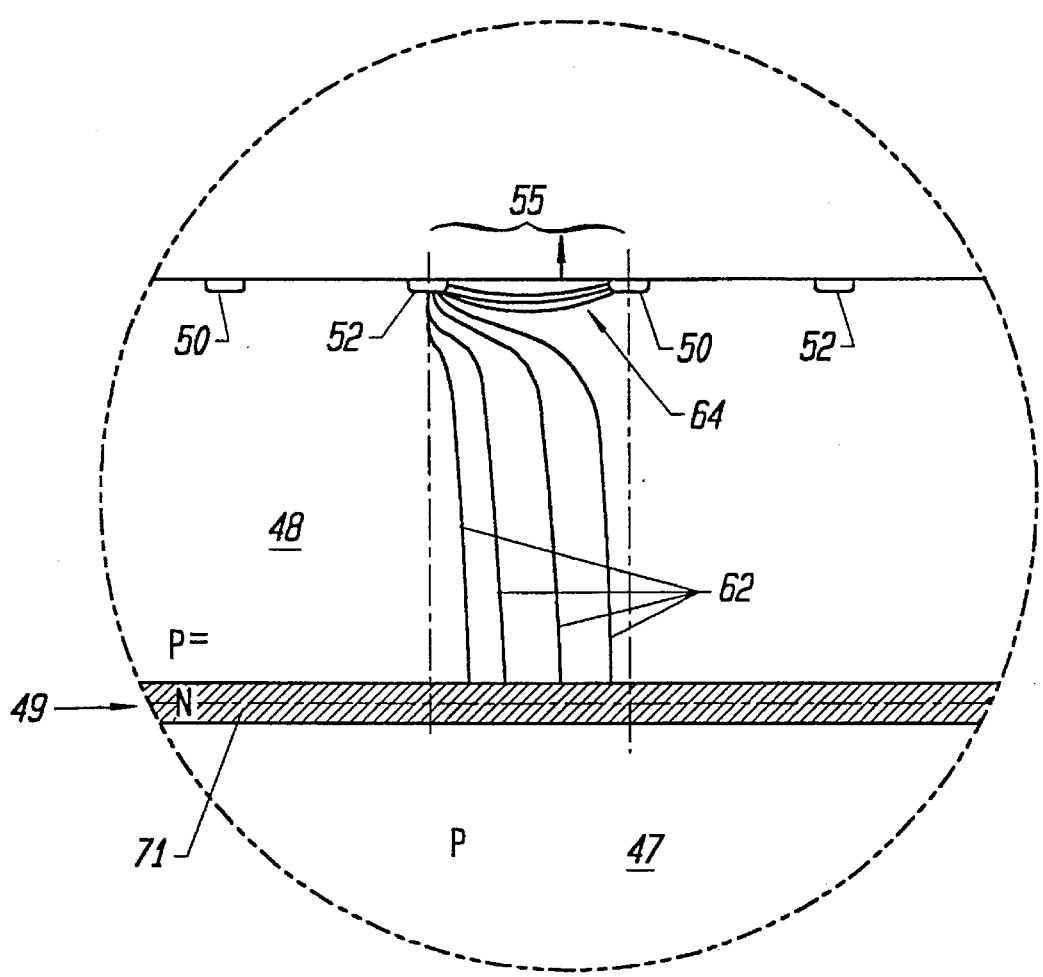
FIG. 10 illustrates a modification of the structure in FIG. 8.
Figure 11:
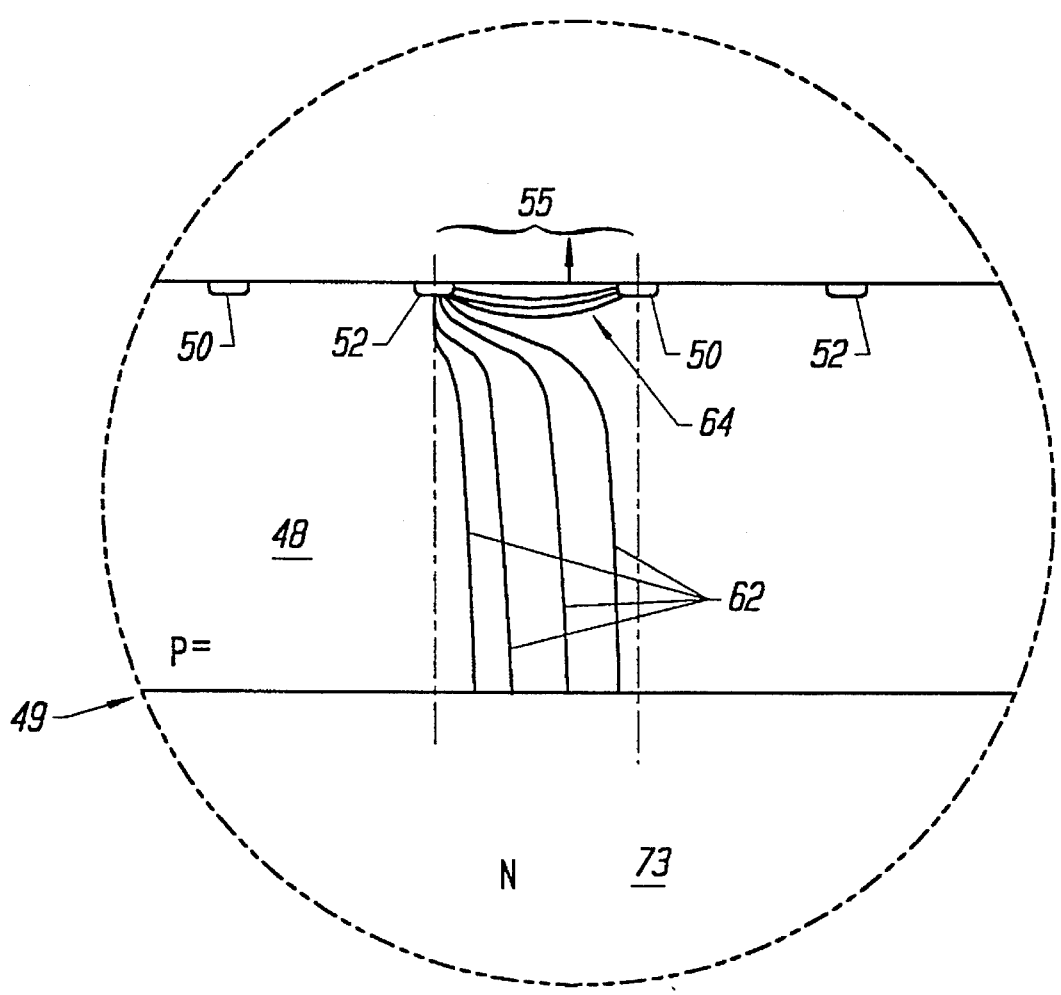
FIG. 11 illustrates another modification of the structure in FIG. 8.

The structure illustrated in FIG. 8 may incorporate two modifications which are illustrated in FIG. 10 and FIG. 11. In FIG. 10, the N-type separated electrodes 66 are replaced by a single continuous N-type electrode 71. In FIG. 11, the substrate 73 is N-type and epi layer 48 is P-type thus omitting the N-type electrodes in FIG. 8.

The structure illustrated in FIGS. 2 and 3 is also subject to potential modification. Several diodes can be created in the substrate. Each diode would have a junction and an electrode on the back side of the substrate, and would have one or more collection electrodes on the front side of the substrate.

In summary, any modifications and variations of the disclosure made above that may be apparent to a person skilled in the art are intended to be included within the scope of this invention.

What is claimed is:

1. A monolithic device for detecting ionization, comprising:

a charge depletable substrate of high purity first conductivity type silicon having first and second surfaces, and a substrate thickness therebetween;

a plurality of spaced-apart collection electrodes of highly doped first conductivity type material disposed adjacent said first surface;

voltage-biasable doped well regions of second conductivity type material forming a first diode junction region at an interface with said substrate, disposed adjacent said first surface between adjacent said collection electrodes;

a region of highly doped second conductivity type material forming a second diode junction region at an interface with said substrate, disposed adjacent said second surface and underlying said collection electrodes;

wherein voltage differentials coupled between said collection electrodes and said well regions, and coupled between said collection electrodes and said region of highly doped second conductivity type material substantially deplete adjacent regions of said substrate and produce an electric field extending from said first and second diode junction regions into said substrate and then to said collection electrodes;

wherein in the presence of ionization said substrate releases charges, released charges of a first polarity tending to follow force lines resulting from said electric field and be directed to said collection electrodes which then collects said first type charges, and wherein released charges of opposite polarity tend to be directed by said force lines to a said first or second diode junction region.

2. The device of claim 1, wherein said first conductivity type is P-type, and said second conductivity type is N-type.

3. The device of claim 1, wherein said first conductivity type is N-type, and said second conductivity type is P-type.

4. The device of claim 1, wherein said ionization is produced by at least one phenomenon selected from the group consisting of (a) incoming charged radiation directly producing primary ionization within said device, and (b) incoming neutral radiation that causes charged particles within said device to be released and to produce secondary ionization, which secondary ionization is detected by said device.

5. The device of claim 1, wherein said incoming neutral radiation is electromagnetic radiation.

6. The device of claim 1, wherein said collection electrodes occupy a small surface area relative to said doped well regions; and wherein said electric field force lines cause substantially all ionization-released charges of a given polarity to be collected by said collection electrodes, notwithstanding that said collection electrodes occupy a small surface area relative to said doped well regions.

7. The device of claim 1, a first end of said force lines terminates upon said collection electrodes, wherein a second end of some of said force lines terminates on a junction present at an interface between said substrate and said voltage-biasable doped well regions, and wherein a second end of remaining said force lines terminates on a junction present at an interface between said substrate and said region of highly doped second conductivity type material.

8. The device of claim 1, further including means for collecting charge from said collection electrodes, said means for collecting having an input node coupled to said collection electrodes and being fabricated within a said voltage-biasable doped well region.

9. A monolithic device for detecting ionization in at least two dimensions, comprising:

a charge depletable substrate of high purity first conductivity type silicon having first and second surfaces, and a substrate thickness therebetween;

a plurality of spaced-apart collection electrodes of highly doped first conductivity type material disposed adjacent said first surface, said electrodes disposed in an array having an x-axis and a y-axis;

voltage-biasable doped well regions of second conductivity type material forming a first diode junction region at an interface with said substrate, disposed adjacent said first surface between adjacent said collection electrodes;

a region of highly doped second conductivity type material forming a second diode junction region at an interface with said substrate, disposed adjacent said second surface and underlying said collection electrodes;

wherein voltage differentials coupled between said collection electrodes and said well regions, and coupled between said collection electrodes and said region of highly doped second conductivity type material substantially deplete adjacent regions of said substrate and produce an electric field extending from said first and second diode junction regions into said substrate and then to said collection electrodes;

wherein in the presence of ionization said substrate releases charges, released charges of a first polarity tending to follow force lines resulting from said electric field and be directed to said collection electrodes which then collects said first type charges, and wherein released charges of opposite polarity tend to be directed by said force lines to a said first or second diode junction region; and means for determining which among said collection electrodes received said released charge and for identifying where on said device said ionization was present.

10. The device of claim 9, wherein said means for determining includes read-out means, fabricated in said well region, for reading-out charge, said read-out means having an input node coupled to an associated said collection electrode.

11. The device of claim 10, wherein said read-out means includes a plurality of metal-on-semiconductor transistors, each said transistor having a gate node coupled to an associated said collection electrode;

wherein charge collected by the associated said collection electrode remains at said gate node to modulate drain-source current flow through said transistor.

12. The device of claim 9, wherein said first conductivity type is P-type, and said second conductivity type is N-type.

13. The device of claim 9, wherein said first conductivity type is N-type, and said second conductivity type is P-type.

14. The device of claim 9, wherein said ionization is produced by at least one phenomenon selected from the group consisting of (a) incoming charged radiation directly producing primary ionization within said device, and (b) incoming neutral radiation that causes charged particles within said device to be released and to produce secondary ionization, which secondary ionization is detected by said device.

15. The device of claim 9, wherein said incoming neutral radiation is electromagnetic radiation.

16. The device of claim 9, wherein said collection electrodes occupy a small surface area relative to said doped well regions; and wherein said electric field force lines cause substantially all ionization-released charges of a given polarity to be collected by said collection electrodes, notwithstanding that said collection electrodes occupy a small surface area relative to said doped well regions.

17. The device of claim 9, wherein a first end of said force lines terminates upon said collection electrodes, wherein a second end of some of said force lines terminates on a junction present at an interface between said substrate and said voltage-biasable doped well regions, and wherein a second end of remaining said force lines terminates on a junction present at an interface between said substrate and said region of highly doped second conductivity type material.

* * * * *